(12) United States Patent
Cordoba

(10) Patent No.: US 6,952,116 B2
(45) Date of Patent: Oct. 4, 2005

(54) NON-CASCADING CHARGE PUMP CIRCUIT AND METHOD

(75) Inventor: Michael V. Cordoba, Boise, ID (US)

(73) Assignee: Micron Technology, Inc., Boise, ID (US)

(*) Notice: Subject to any disclaimer, the term of this patent is extended or adjusted under 35 U.S.C. 154(b) by 44 days.

(21) Appl. No.: 10/675,661

(22) Filed: Sep. 29, 2003

(65) Prior Publication Data
US 2005/0068811 A1 Mar. 31, 2005

(51) Int. Cl.[7] .......................... H03K 19/094; G05F 3/02
(52) U.S. Cl. .................. 326/88; 327/536; 365/189.11
(58) Field of Search .................. 326/88, 92; 327/536, 327/537; 365/189.11

(56) References Cited

U.S. PATENT DOCUMENTS

| 5,126,590 A | | 6/1992 | Chern | 307/296.2 |
|---|---|---|---|---|
| 5,412,257 A | * | 5/1995 | Cordoba et al. | 327/536 |
| 5,537,306 A | | 7/1996 | Blodgett | 363/60 |
| 5,642,073 A | | 6/1997 | Manning | 327/536 |
| 5,677,645 A | | 10/1997 | Merritt | 327/536 |
| 5,677,649 A | | 10/1997 | Martin | 331/57 |
| 5,818,289 A | | 10/1998 | Chevallier et al. | 327/536 |
| 5,939,935 A | | 8/1999 | Merritt | 327/536 |
| 6,154,088 A | | 11/2000 | Chevallier et al. | 327/536 |
| 6,160,723 A | * | 12/2000 | Liu | 363/60 |
| 6,307,425 B1 | | 10/2001 | Chevallier et al. | 327/536 |
| 6,384,669 B2 | | 5/2002 | Mecier et al. | 327/536 |
| 6,456,152 B1 | * | 9/2002 | Tanaka | 327/536 |
| 6,801,076 B1 | | 10/2004 | Merritt | 327/536 |
| 2002/0014907 A1 | * | 2/2002 | Blodgett et al. | 327/536 |

* cited by examiner

Primary Examiner—Daniel D. Chang
(74) Attorney, Agent, or Firm—Dorsey & Whitney LLP

(57) ABSTRACT

A charge pump includes a pair of capacitors each having a first terminal coupled to a pumped node. A charge voltage is initially applied to the pumped node to charge the capacitors. A second terminal of the first capacitor is then pumped to increase the voltage at the pumped node, with the charge of the first capacitor being shared with the second capacitor. The second terminal of the second capacitor is then pumped to again increase the voltage at the pumped node. The pumped node is then coupled to an output terminal.

53 Claims, 9 Drawing Sheets

NON-CASCADING CHARGE PUMP CIRCUIT AND METHOD

TECHNICAL FIELD

This invention relates to integrated circuit charge pumps, and, more particularly, to a charge pump that is able to generate an output voltage having a magnitude that is significantly greater than the magnitude of a supply voltage without using multiple charge pump stages that are sequentially coupled to each other in a cascading typography.

BACKGROUND OF THE INVENTION

Charge pumps are well know circuits that are used to generate a "pumped voltage" that having a magnitude that is larger than the magnitude of a supply voltage. Normally the supply voltage is used to power most of the circuits in an integrated circuit, and the pumped voltage is used to power a relatively few of the circuits in the integrated circuit. For example, pumped voltages are commonly used to supply power to word line drivers and output buffers in integrated circuit dynamic random access memory ("DRAM") devices, although the remaining circuitry in the DRAM is powered by a supply voltage. When used to power word line drivers and output buffers, the pumped voltage allows NMOS transistors in those circuits to pass the full magnitude of the supply voltage. Charge pumps are also used to generate voltages that have a polarity that is opposite the polarity of a supply voltage. For example, in a DRAM device powered by a positive supply voltage, a charge pump is often used to generate a negative voltage that is used to negatively bias either the substrate of the integrated circuit or a well fabricated in the integrated circuit. Biasing the substrate or well negatively reduces the leakage current of NMOS transistors in their OFF condition.

The principle of operation of conventional charge pumps is illustrated in FIGS. 1A and 1B. As shown in FIG. 1A, a capacitor 10 has first and second plates 12, 14, respectively, separated from each other by a dielectric. The first plate 12 of the capacitor 10 is coupled to suitable circuitry (not shown) that drives the first plate to a relatively low voltage, such as 0 volts, in a phase of operation. The second plate 14 of the capacitor 10 is also coupled to suitable circuitry (not shown) that charges the capacitor 10 in the first phase so that the voltage on the second plate 14 rises to a suitable voltage, such as the supply voltage $V_{CC}$.

In a second phase of operation, the circuitry (not shown) coupled to the second plate 14 drives the second plate 14 to a suitable voltage, such as $V_{CC}$, as shown in FIG. 1B. As a result, the voltage of the first plate 12 increases to twice $V_{CC}$. This voltage $2V_{CC}$ on the second plate is then coupled to an output node 20 through a suitable switching device, which is normally an NMOS transistor 22. The NMOS transistor 22 is normally turned ON to couple the plate 14 to the output node 20 by coupling the gate and drain of the transistor 22 to each other in a diode-coupled arrangement. As is well known in the art, a voltage coupled through a diode coupled transistor is reduced by a threshold voltage $V_T$, which is typically about 0.7 volts. Thus, in practice, the pumped voltage applied to the output node 20 is $2V_{CC}-V_T$.

The circuitry shown in FIG. 1B is known as a "charge pump stage," and, as explained above, it is able to generated a pumped voltage of $2V_{CC}-V_T$. A single charge pump stage shown in FIGS. 1A and 1B is suitable in some applications. However, in many applications, a pumped voltage having a magnitude greater than $2V_{CC}-V_T$ is required. This larger voltage can be provided by coupling multiple charge pump stages of the type shown in FIGS. 1A and 1B to each other in a "cascading" topography in which the pumped voltage from each charge pump stages is boosted by the subsequent charge pump stage. For example, in a three-stage charge pump, the first stage increases a supply voltage $V_{CC}$ to $2V_{CC}-V_T$, as previously explained, the second stage increases that voltage to $3V_{CC}-2V_T$, and the third stage increases that voltage to $4V_{CC}-3V_T$. For a typical $V_{CC}$ of 3 volts and a typical $V_T$ of 0.7 volts, the three-stage charge pump can produce a pumped voltage of 9.9 volts ((4*3)−(3*0.7)).

Although a multiple stage charge pump can produce relatively large voltages, it does so at the price of very poor efficiency. As is well known in the art, the efficiency "E" of a multiple stage charge pump is given by the formula E=1/(N+1), where "N" is the number of stages in the charge pump. The efficiency of a one-stage charge pump is thus 50%, the efficiency of a two-stage charge pump is 33%, the efficiency of a three-stage charge pump is 25%, etc. While this relatively low efficiency is acceptable in some applications, it can be a substantial problem in many other applications. For example, in battery-powered portable devices, such as notebook personal computers, the inefficiency of multiple-stage charge pumps can significantly reduce the time the devices can be used before a battery recharge is needed.

There is therefore a need for a charge pump circuit and method that can produce a pumped voltage greater than can be achieved with a single stage charge pump with significantly higher efficiencies than can be achieved with multiple-stage charge pumps.

SUMMARY OF THE INVENTION

A charge pump and method comprises a plurality of capacitors each having a first terminal coupled to a pumped node. A charging circuit charges all of the capacitors through the pumped node while a second terminal of each of the capacitors is held at a first voltage. A pumping circuit coupled to the second terminal of each of the capacitors sequentially changes the voltage at the second terminal of each capacitor from the first voltage to a second voltage. Afterward, an isolation circuit isolates the second terminal of that capacitor before the pumping circuit for a subsequent capacitor changes the voltage at the second terminal of that capacitor from the first voltage to the second voltage. When the pumping circuit for a final capacitor has changed the voltage at the second terminal of the capacitor from the first voltage to the second voltage, an output circuit couples the pumped node to an output terminal.

DETAILED DESCRIPTION OF THE INVENTION

Figure 1A:
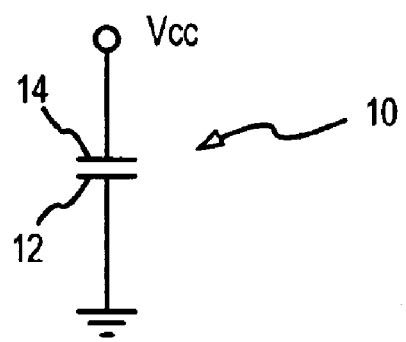
FIGS. 1A and 1B are schematic diagrams of a conventional single-stage charge pump.
Figure 1B:
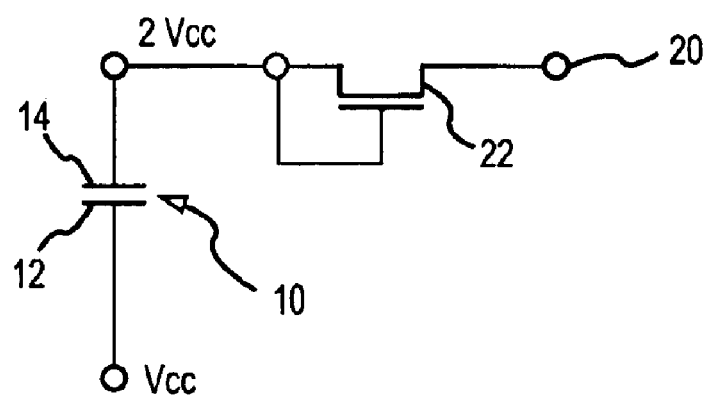
Figure 2:
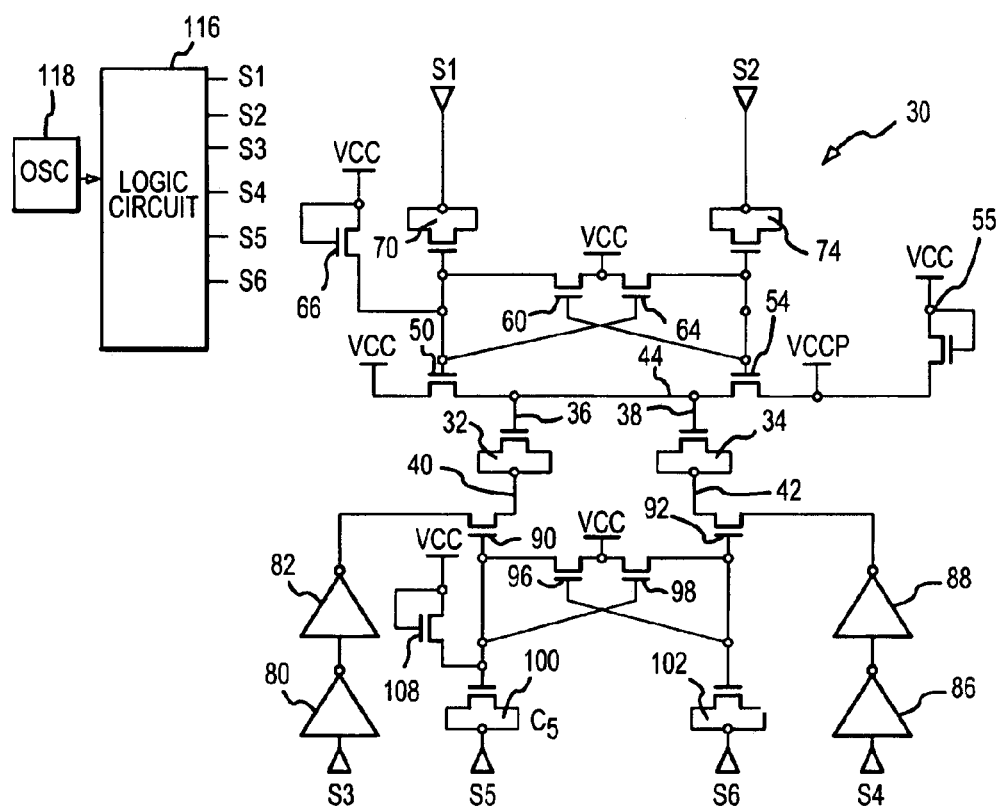
FIG. 2 is a schematic and logic diagram of a charge pump according to one embodiment of the present invention.

One embodiment of a charge pump 30 according to one embodiment of the invention is shown in FIG. 2. The charge pump 30 operates on the principle of initially charging a plurality of capacitors, and then sequentially pumping each of them to increase the voltage at the junction between the capacitors, which serves as an output node. After each capacitor is pumped, it is isolated so that the next capacitor in the sequence so that the next capacitor in the sequence can be pumped to further increase the voltage at the output node.

With reference to FIG. 2, the charge pump 30 includes first and second capacitors 32, 34, which are in the form of respective NMOS transistors having their gate acting as one capacitor plate 36, 38, respectively, and their sources and drains coupled to each other to act as the other capacitor plate 40, 42, respectively. However, it will be understood that discrete capacitors or other capacitive devices can also be used. The capacitor plates 36, 38 are coupled to a common node 44. The node 44 is also coupled to $V_{CC}$ through an NMOS transistor 50, through which current flows is used to charge the capacitors 32, 34. Also coupled to the node 44 is an output NMOS transistor 54, which is used to couple the node 44 to a pumped voltage output terminal $V_{CCP}$. The gates of the transistors 50, 54 are coupled to $V_{CC}$ through respective NMOS transistors 60, 64, which are cross-coupled so that $V_{CC}$ is coupled to the gate of only one of the transistors 50, 54. The gate of the transistor 50 is also coupled to $V_{CC}$ through a diode-coupled NMOS transistor 66, which is used at power-up to bias the gate to $V_{CC}-V_T$. Finally, the gates of the transistors 50, 54 are coupled through respective capacitors 70, 74 to respective signals S1S1, S2S2. As will be explained below, the capacitors 70, 74 are used to selectively pump the gates of the transistors 50, 54 to a voltage in excess of $V_{CC}$ so that the transistors 50, 54 can pass a voltage having a magnitude of greater than $V_{CC}$ to the node 44 and the output terminal $V_{CCP}$, respectively.

The other plates 40, 42 of the capacitors 32, 34 are coupled to respective pairs of inverters 80, 82 and 86, 88 by respective NMOS transistors 90, 92. Each of the 80, 82 and 86, 88 is driven by a respective signal S3S3 and S4S4. The gates of the transistors 90, 92 are coupled to $V_{CC}$ through respective cross-coupled NMOS transistors 96, 98 so that $V_{CC}$ is coupled to the date of only one of the transistors 90, 92 at a time. The gates of the transistors 90, 92 are also coupled through respective capacitors 100, 102 to respective signals S5S5, S6S6. Finally, the gate of the transistor 90 is coupled to $V_{CC}$ through a diode-coupled NMOS transistor 108, which is used at power-up to bias the gate to $V_{CC}-V_T$. As described in greater detail below, the above-described circuitry that is coupled to the plates 40, 42 of the capacitors 32, 34 is used to selectively pump the plates 40, 42 of the capacitors 32, 34 to a relatively high voltage. This circuitry, in turn, includes charge pump circuits that are used to pump the voltage applied to the gates of the transistors 90, 92 to sufficient levels that the transistors 90, 92 can pass voltages of at least $V_{CC}$. This is accomplished by selectively turning ON the transistors 96, 98 to charge the capacitors 100, 102 to voltages at or near $V_{CC}$ so that when the S5 and S6 signals transition to $V_{CC}$, the voltage applied to the gates of the transistors 90, 92 will be well above $V_{CC}$.

The charge pump 30 also includes a logic circuit 116 driven by an oscillator 118 for generating the S2, S1, S5, S3, S6 and S4 signals. The design the logic circuit will be apparent to one skilled in the art. For example, the logic circuit 116 could include a counter (not shown) incremented by a periodic signal from the oscillator 118, and logic gates (not shown) decoding respective counts of the counter at the times $T_0-T_8$ where the above signals transition. Other designs will be apparent to one skilled in the art.

Figure 3A:
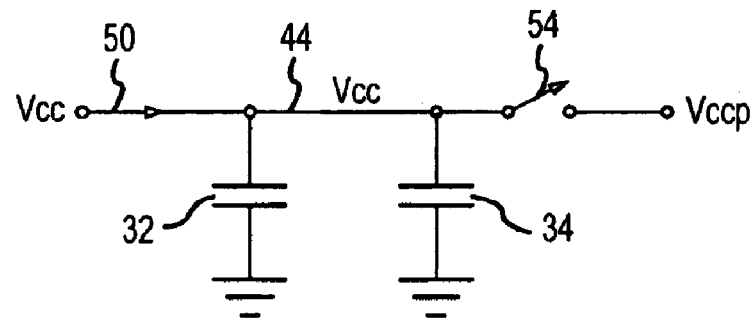
FIGS. 3A–3E are schematic diagrams illustrating the operation of the charge pump of FIG. 2 at various phases of operation.
Figure 3B:
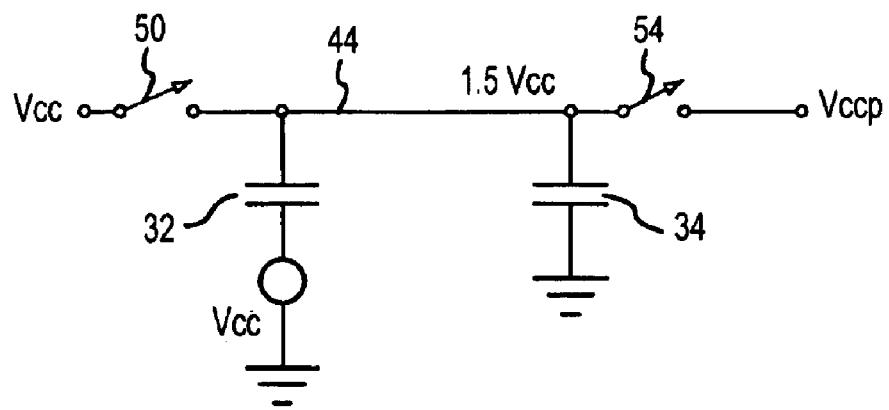
Figure 3C:
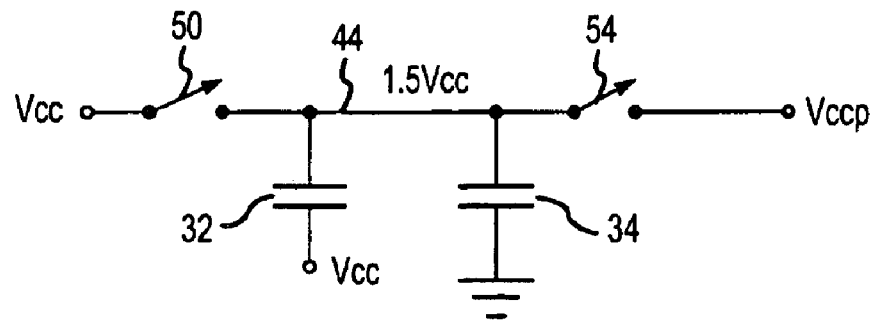
Figure 3D:
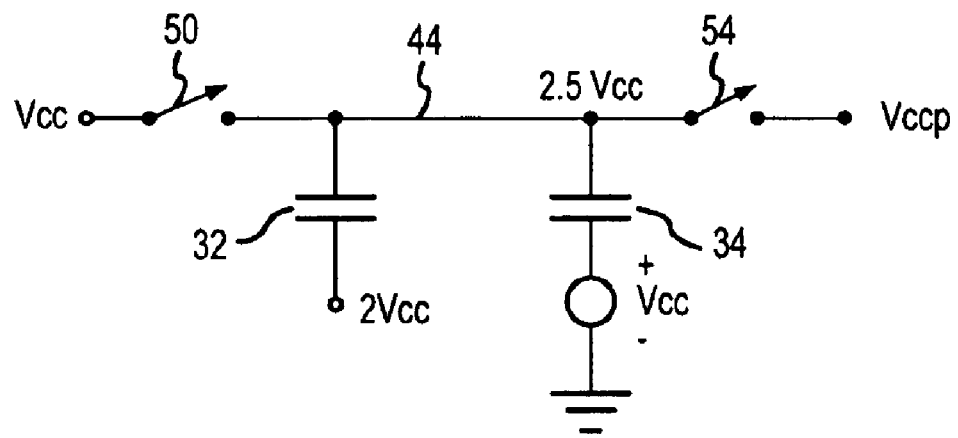
Figure 3E:
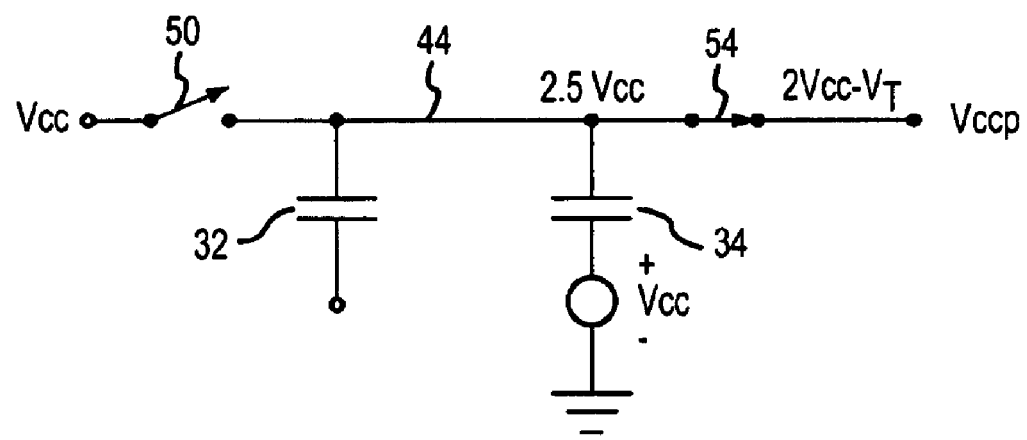
Figure 4:
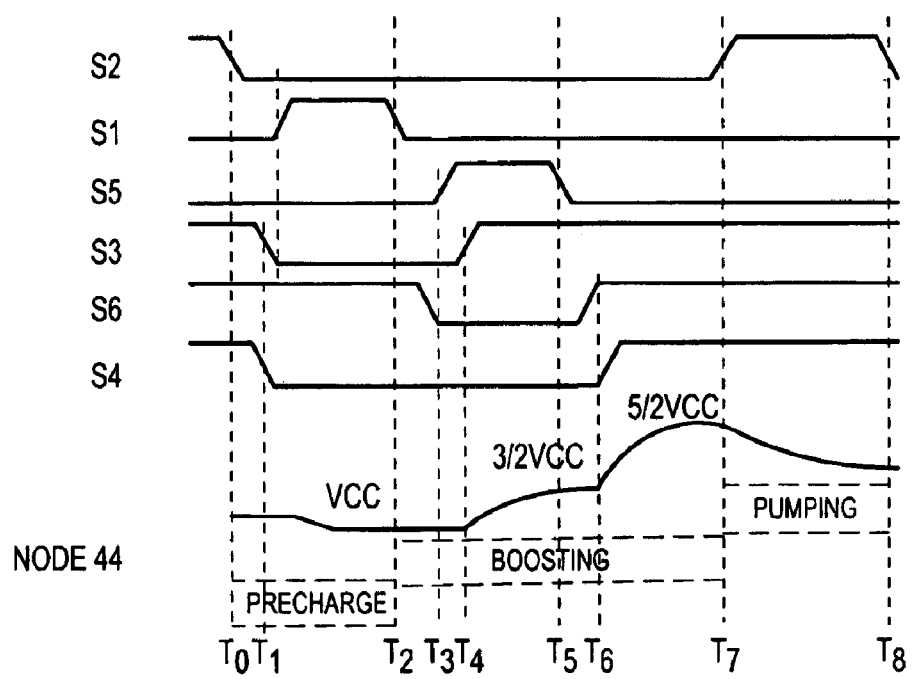
FIG. 4 is a timing diagram showing the voltages present at various nodes in the charge pump of FIG. 2.

The operation of the charge pump 30 shown in FIG. 2 will now be explained with reference to the circuit schematic diagrams shown in FIGS. 3A–3E and the timing diagram of FIG. 4. With reference to FIGS. 2 and 4, prior to power-up, both capacitors 32, 34 are discharged and although their plates 36, 40 and 38, 42 are zero volts. At power-up, the supply voltage $V_{CC}$ less the threshold voltage (i.e., $V_{CC}-V_T$) is applied through the diode-coupled transistor 66 to turn ON the NMOS charging transistor 50, which charges the capacitors 32, 34 to $V_{CC}-2V_T$. The voltage coupled through the transistor 66 also charges the capacitor 70 to $V_{CC}-V_T$, and turns ON the cross-coupled NMOS transistor 64, which charges the capacitor 74 to $V_{CC}-V_T$. At power-up, $V_{CC}-V_T$ is also coupled through the diode-coupled transistor 108 to turn ON the transistor 90 and the cross-coupled NMOS transistor 98. The transistor 98 then couples $V_{CC}-V_T$ to the gate of the transistor 92 to turn it ON. Since S3 and S4 are high (which is assumed to be $V_{CC}$), the lower plate 40 of the capacitor 32 is charged to $V_{CC}-2V_T$, and the lower plate 42 of the capacitor 34 is charged to $V_{CC}-2V_T$.

At time $T_0$, the S2 signal transitions low to ensure that the cross-coupled NMOS transistor 60 is turned OFF. At $T_1$, the S1 signal transitions high to increase the voltage on the gate of the charging transistor 50 to well above $V_{CC}$. The charging transistor 50 is therefore able to couple the full supply voltage $V_{CC}$ to the capacitors 32, 34 to charge them to that voltage. The gate of the cross-coupled transistor 64 is also driven substantially above $V_{CC}$ to turn ON the transistor 64 sufficiently to charge the capacitor 74 to $V_{CC}$. The gate of the output transistor 54 is therefore turned OFF to isolate the capacitors 32, 34 from the $V_{CCP}$ output terminal. Also occurring at $T_1$ are the transitions of the S3 and S4 signals low. Since, the transistors 90, 92 have been turned ON as previously explained, the lower plates 40, 42 of the capacitors 32, 34, respectively, are driven to ground potential. At this time, the capacitors 32, 34 are charged to the voltages shown in FIG. 3A.

At time $T_2$, the S1 signal transitions low to turn OFF the charging transistor 50, which terminates charging of the capacitors 32, 34.

At time $T_3$, the S5 signal transitions high to turn ON the transistor 90 to maintain the plate 40 of the capacitor 32 at ground, and the S6 signal transitions low to turn OFF the transistor 92 and isolate the plate 42 of the capacitor 34 from ground. The high S5 signal also maintains the transistor 98 ON, which, in turn, holds the gate of the transistor 92 at $V_{CC}$ to charge a capacitor 102 to $V_{CC}$. A short time later at $T_4$, the S3 signal transitions high to apply $V_{CC}$ to the drain of the NMOS transistor 90. As previously explained, since the capacitor 100 has been charged to $V_{CC}$ though the transistor 98, the high transition of the S5 signal coupled through the capacitor 100 causes the voltage on the gate of the transistor 90 to rise to well above $V_{CC}$. Therefore, the voltage on the plate 40 of the capacitor 32 increases to $V_{CC}$. If the capacitor 32 was not coupled to the node 44, the voltage on the plate 36 of the capacitor would increase to 2 $V_{CC}$. However, since the charge on the capacitor 32 is shared by the capacitor 34, the capacitors 32, 34 are charged to 1.5 $V_{CC}$, as shown in FIG. 3B, assuming the capacitors 32, 34 have equal capacitance.

At time T5, the S5 signal transitions low to turn OFF the transistor 90, which then isolates the plate 40 of the capacitor 32. At this time, the capacitors 32, 34 are charged to the voltages shown in FIG. 3C. The low transition of the S5 signal also turns OFF the transistor 98 to isolate the gate of the transistor 92 from VCC.

When the S6 transitions high at T6, this transition is coupled through the capacitor 102 to the gate of the transistor 96, thereby turning on the transistor 96. The capacitor 100 is then charged to a voltage substantially equal to $V_{CC}$ through the transistor 96. The high transition of S6 is also coupled to the gate of the transistor 92 so that the voltage at the gate increases to well above $V_{CC}$ since, as previously explained, the capacitor 102 has been charged to $V_{CC}$ through the transistor 98. As a result, the transistor 92 is turned ON. A short time later, the S4 signal transitions high, thereby causing the output of the inverter 88 to transition high. The voltage on the plate 42 of the capacitor 92 therefore increases from ground to $V_{CC}$. Since the plate 40 of the capacitor 32 is now floating, the charge on the capacitor 34 is not shared with the capacitor 32. Therefore, the voltage at the node 44 increases to 2.5 $V_{CC}$, as shown in FIG. 3D. The charge pump 30 is thus able to generate 2.5 $V_{CC}$ with a single charge pump stage, which is an accomplishment that has been heretofore not possible. It should be noted that, unlike the capacitor 32, it is not necessary to isolate the capacitor 34 from a voltage source at any time.

At time $T_7$, the S2 signal increases. Since the capacitor 74 has been charged to $V_{CC}$, the increase in the S2 signal causes the voltage at the drain of the output transistor 54 to rise to $2V_{CC}$. As a result, the transistor 54 is able to couple the capacitor 34 to the $V_{CCP}$ terminal as long as the voltage on the $V_{CCP}$ terminal is less than $2V_{CC}-V_T$, as shown in FIG. 3E. The capacitor then discharges to the $V_{CCP}$ terminal, as shown in FIG. 4.

Finally, at time $T_8$, the S2 signal transitions low to turn OFF the output transistor 54 and isolate the $V_{CCP}$ terminal from the node 44. The previously described cycle then repeats itself to again pump the node 44 to 2.5$V_{CC}$.

Although the charge pump 30 uses two capacitors 30, 32, it should be understood that a greater number of capacitors can be used to increase the pumped voltage without the additional cost of isolation transistors between capacitors. For example, if three capacitors of equal capacitance were used, when the first capacitor was pumped up, the charge would be shared by the two other capacitors so the pumped voltage would increase to 1.33 $V_{CC}$. When the second capacitor was pumped up, the charge would be shared by the one remaining capacitor so the pumped voltage would increase to 1.83 $V_{CC}$. Finally, when the last capacitor was pumped up, the pumped voltage would increase to 2.83 $V_{CC}$. Note that the final pumped voltage for a given number of capacitors can also be adjusted by adjusting the capacitance of the capacitors. For example, if the first capacitor had a capacitance of C, the second capacitor had a capacitance of 0.5 C, and the third capacitor had a capacitance of 0.25 C, the final pumped voltage would be higher than 2.83$V_{CC}$. More specifically, when the first capacitor was pumped up, the charge on the capacitor with C capacitance would be shared by the two other capacitors with a total capacitance of 0.75 C. As a result, so the pumped voltage would increase to 1.57 $V_{CC}$. When the second capacitor was pumped up, the charge on the capacitance of 0.5 C would be shared by the one remaining capacitor with a capacitance of 0.25 C so the pumped voltage would increase to 2.23 $V_{CC}$. Finally, when the last capacitor was pumped up, the pumped voltage would increase to 3.23$V_{CC}$. Although the final pumped voltage in this embodiment is substantially higher than the pumped voltage of 2.5 $V_{CC}$ obtained using three equally sized capacitors, using a smaller capacitor as the final capacitor reduces the current driving capacity of the charge pump.

Figure 5:
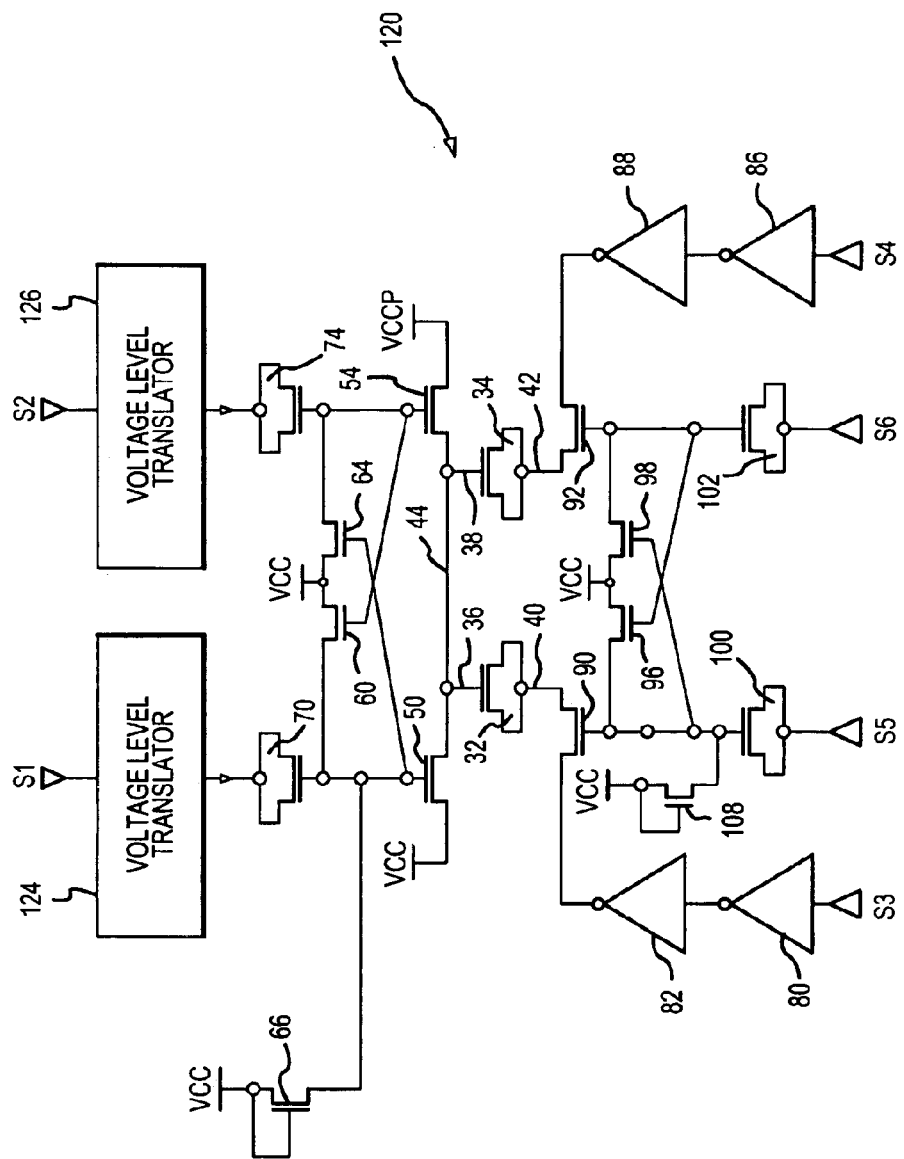
FIG. 5 is a schematic and logic diagram of a charge pump according to another embodiment of the present invention.

As explained above with reference to FIG. 2, although the node 44 is charged to 2.5$V_{CC}$, the charge pump circuit 30 is only able to output a voltage of $2V_{CC}-V_T$ because the voltage at the gate of the transistor 54 increases only to $2V_{CC}$ when the S2 signal transitions high. A charge pump 120 that allows the full magnitude of the voltage developed at the node 44 to be coupled to the $V_{CCP}$ terminal is shown in FIG. 5. The charge pump 120 uses the same components used in the charge pump 30 of FIG. 2, and they have been provided with the same reference numerals. However, the charge pump 120 of FIG. 5 uses voltage level translators 124, 126, as shown in FIG. 5. The voltage level translators 124, 126 output a voltage of zero volts when the S1 and S2 signals are at zero volts. However, when the S1 and S2 signals are at $V_{CC}$, the level translators 124, 126 output a voltage of at least 2.5$V_{CC}-V_T$ so that the output transistor 54 can pass the 2.5$V_{CC}$ voltage on the node 44 to the $V_{CC}$, terminal.

Figure 6:
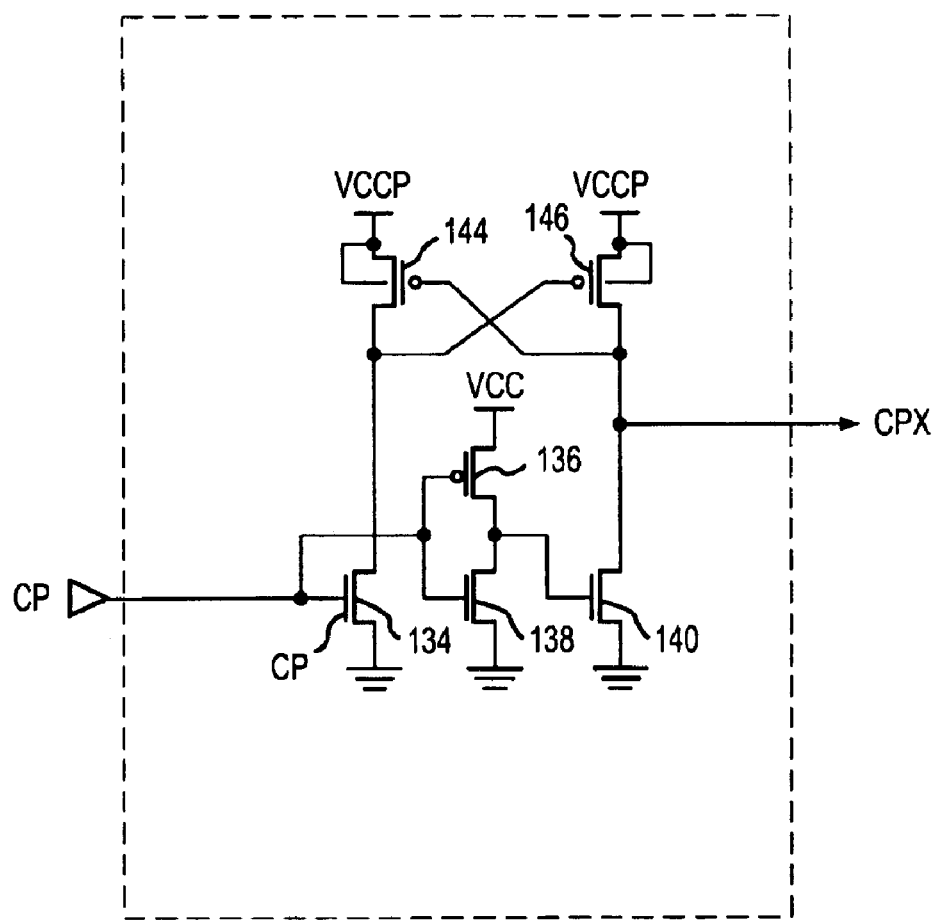
FIG. 6 is a schematic diagram of a level translator circuit that can be used in the charge pump of FIG. 5.

One embodiment of the voltage level translators is shown in FIG. 6. The voltage level translator 130 includes an input NMOS transistor 134 coupled to receive the S1 or S2 signals (shown as a "CP" signal). The CP signal is also applied to an inverter formed by a PMOS transistor 136 and an NMOS transistor 138. The output of this inverter is applied to the gate of an NMOS output transistor 140. The drains of the NMOS transistors 134, 140 are coupled to the drains of respective cross-coupled PMOS transistors 144, 146. Significantly, the sources of the PMOS transistors 144, 146 are coupled to the $V_{CCP}$ node, which eventually reaches a level of 2.5$V_{CC}$.

In operation, when the CP signal is at zero volts, the NMOS transistors 234, 138 coupled to the CP signal are turned OFF, and the PMOS transistor 136 coupled to the CP signal is turned ON. As a result, the NMOS output transistor 140 is turned ON to drive the CPX output to zero volts, which turns ON the PMOS transistor 144. The PMOS transistor 144 then couples $V_{CCP}$ to the gate of the PMOS transistor 146 to turn the transistor 146 OFF. Therefore, when the CP signal is at zero volts, the CPX signal is also at zero volts.

When the CP signal at $V_{CC}$, the NMOS transistor 134 is turned ON, which drives the gate of the PMOS transistor 146 low to turn ON the transistor 146. The transistor 146 then couples $V_{CCP}$ to the CPX output, which also turns OFF the PMOS transistor 144. The high CP signal also turns ON the NMOS transistor 138 and turns OFF the PMOS transistor 136, which, in turn, turns OFF the output NMOS transistor 140. Therefore, when the CP signal is at $V_{CC}$, the CPX signal is at $V_{CCP}$. It should be noted that if the magnitude of $V_{CCP}$ decreases from 2.5$V_{CC}$ as the capacitor 34 is discharged, the CPX signal will still maintain the output transistor 54 (FIG. 5) ON. Since the capacitor 74 is charged to $V_{CC}$ before S2 transitions to $V_{CCP}$, the gate of the output transistor 54 will be at $V_{CC}+V_{CCP}$. This voltage of $V_{CC}+V_{CCP}$ will always be greater than $V_{CCP}-V_T$ to pass the full magnitude of the voltage on the node 44.

Figure 7:
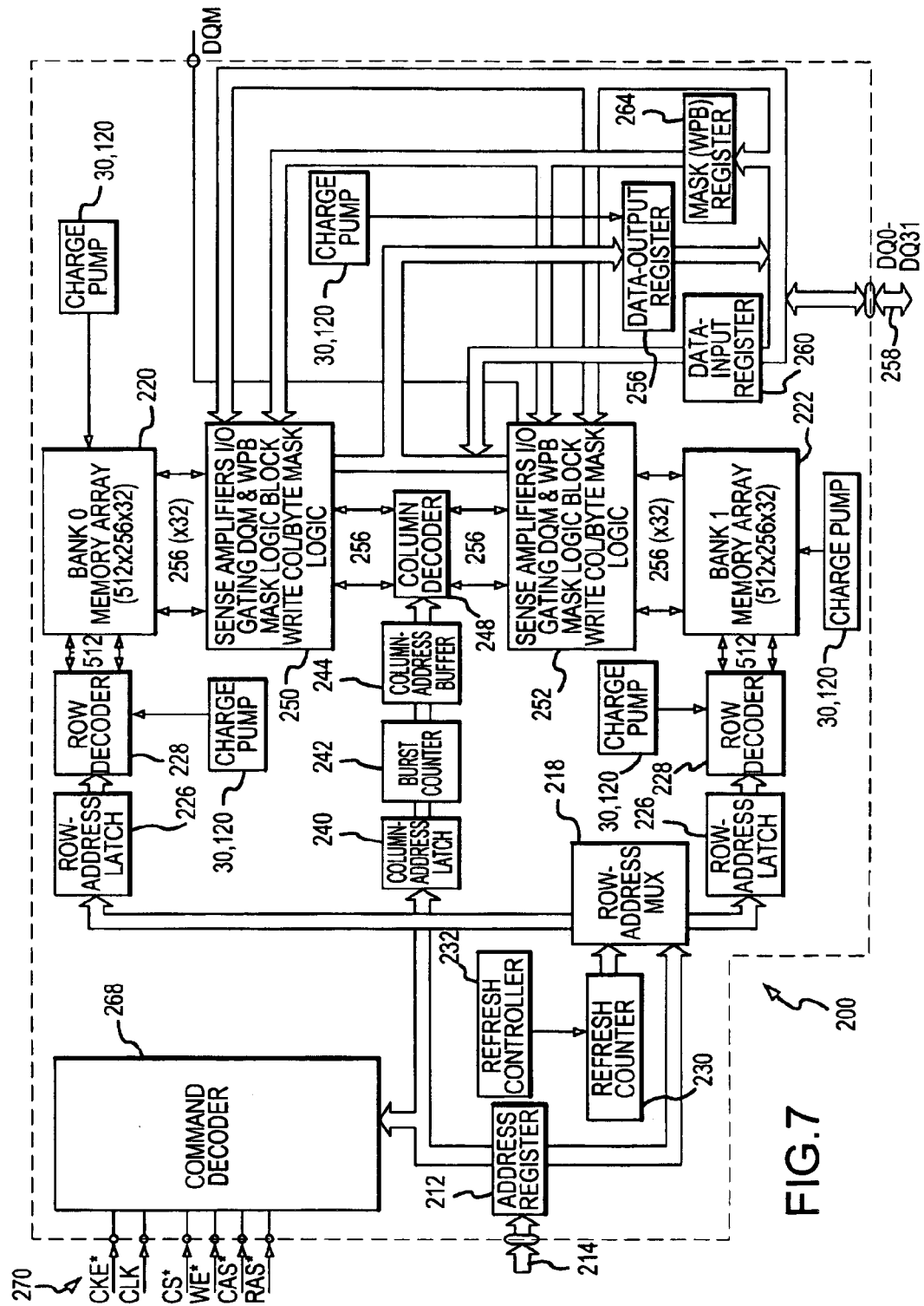
FIG. 7 is a block diagram of a memory device using the charge pump of FIGS. 2 or 5 or some other embodiment of the invention.

One embodiment of a memory device using one or more of the charge pumps 30, 120 or some other embodiment of the invention is shown in FIG. 7. The memory device illustrated therein is a synchronous dynamic random access memory ("SDRAM") 200, although the invention can be embodied in other types of synchronous DRAMs, such as packetized DRAMs and RAMBUS DRAMs (RDRAMS"), as well as other types of digital devices. The SDRAM 200 includes an address register 212 that receives either a row address or a column address on an address bus 214. The address bus 214 is generally coupled to a memory controller (not shown in FIG. 7). Typically, a row address is initially received by the address register 212 and applied to a row address multiplexer 218. The row address multiplexer 218 couples the row address to a number of components associated with either of two memory arrays 220, 222 depending upon the state of a bank address bit forming part of the row address.

Associated with each of the memory arrays 220, 222 is a respective row address latch 226, which stores the row address, and a row decoder 228; which applies various signals to its respective array 220 or 222 as a function of the stored row address. These signals include word line voltages that activate respective rows of memory cells in the memory arrays 220, 222. The row decoders 228 are each coupled to one of the charge pumps 30, 120 to receive a voltage significantly greater than $V_{CC}$. The row decoder 228 is therefore able to generate word line voltages having a sufficient magnitude to couple $V_{CC}$ to memory cell capacitors in the memory arrays 220, 222. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248 which applies various signals to respective sense amplifiers and associated column circuitry 250, 252 for the respective arrays 220, 222. The substrates of the arrays 220, 222 are coupled to one of the charge pumps 30, 120 to receive a negative voltage $V_{BB}$. As is well known in the art, biasing the substrate to a negative voltage reduces the leakage current through access transistors in the memory arrays 220, 222. The charge pumps 30, 120 shown in FIGS. 2 and 5, respectively, can generate a negative voltage by either using a negative voltage for $V_{CC}$ and substituting PMOS transistors for NMOS transistors and vice-versa, or altering the circuitry shown in FIGS. 2 and 5. For example, circuitry could easily be devised to ground the node 44 and coupled the plate 42 of the capacitor to the $V_{CCP}$ terminal to discharge the capacitor 42.

Data to be read from one of the arrays 220, 222 is coupled to the column circuitry 250, 252 for one of the arrays 220, 222, respectively. The data is then coupled through a read data path 254 to a data output register 256, which applies the data to a data bus 258. The data output register 256 is powered by one of the charge pumps 30, 120 to receive a voltage significantly greater than $V_{CC}$. The data output register 256 is therefore able to use an NMOS transistor (not shown) to couple $V_{CC}$ to the data bus 258 since a voltage of at least $V_{CC}+V_T$ can be applied to the gate of the output transistor.

Data to be written to one of the arrays 220, 222 is coupled from the data bus 258 through a data input register 260 and a write data path 262 to the column circuitry 250, 252 where it is transferred to one of the arrays 220, 222, respectively. A mask register 264 may be used to selectively alter the flow of data into and out of the column circuitry 250, 252, such as by selectively masking data to be read from the arrays 220, 222.

The above-described operation of the SDRAM 200 is controlled by a command decoder 268 responsive to command signals received on a control bus 270. These high level command signals, which are typically generated by a memory controller (not shown in FIG. 6), are a clock enable signal CKE*, a clock signal CLK, a chip select signal CS*, a write enable signal WE*, a row address strobe signal RAS*, and a column address strobe signal CAS*, which the "*" designating the signal as active low. Various combinations of these signals are registered as respective commands, such as a read command or a write command. The command decoder 268 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted.

Figure 8:
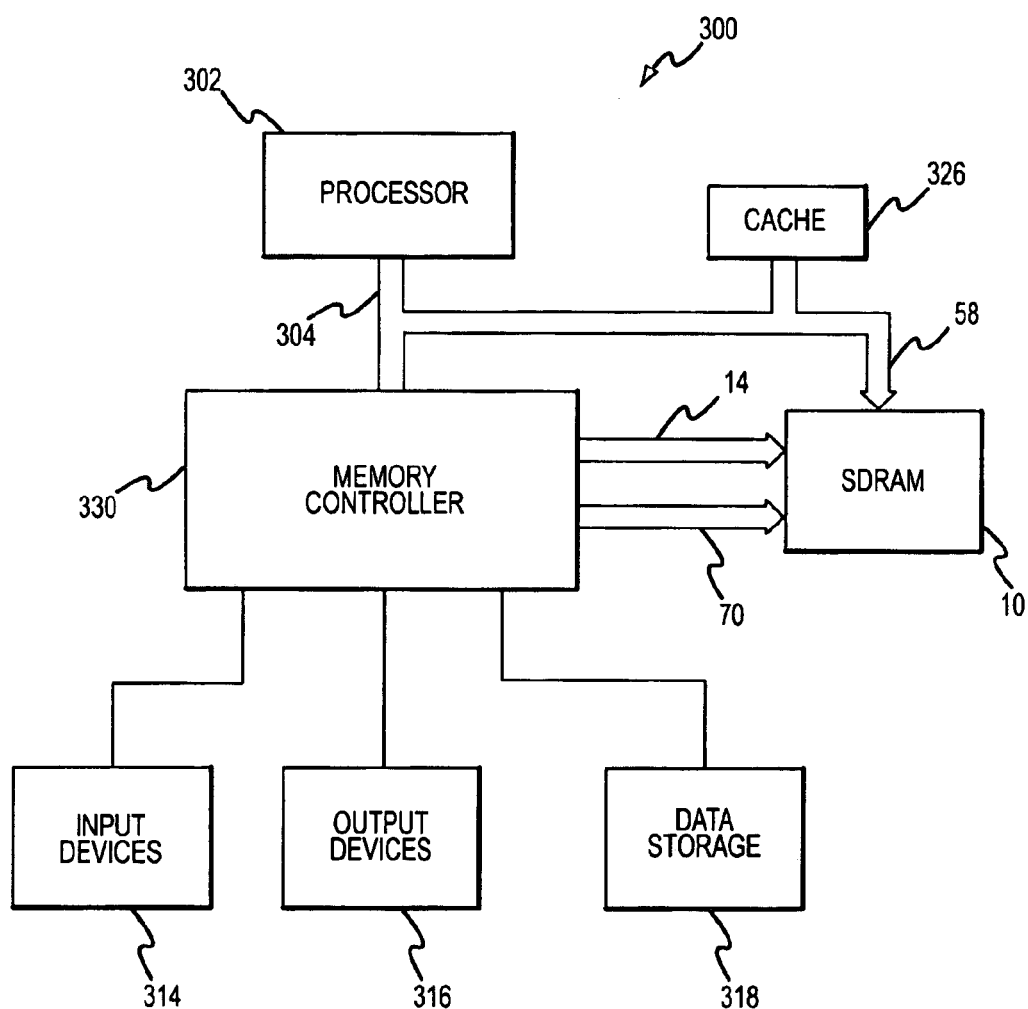
FIG. 8 is a block diagram of a computer system using the memory device of FIG. 7.

FIG. 8 shows a computer system 300 containing the SDRAM 200 of FIG. 7. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM 200 through a memory controller 330. The memory controller 330 normally includes a control bus 336 and an address bus 338 that are coupled to the SDRAM 200. A data bus 340 is coupled from the SDRAM 200 to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. For example, charge pumps according to the invention can use any number of capacitors with any desired capacitances relative to each other. Also, memory devices can use various embodiments of the invention charge pump to power components other than the memory array substrate, the row decoder and the data output register. Accordingly, the invention is not limited except as by the appended claims.

What is claimed is:

1. A charge pump, comprising:
    a first capacitor having first and second terminals, the first terminal being coupled to a pumped node;
    a second capacitor having first and second terminals, the first terminal being coupled to the pumped node;
    a charging circuit coupled to the pumped node, the charging circuit being operable to charge the first and second capacitors through the pumped node responsive to a charge enable signal;
    a first pumping circuit having an output signal, the first pumping circuit transitioning the output signal from a first logic level to a second logic level responsive to a predetermined transition of a first control signal;
    a second pumping circuit having an output signal, the second pumping circuit transitioning the output signal from a third logic level to a fourth logic level responsive to a predetermined transition of a second control signal;
    a first isolation circuit coupled between the output of the first pumping circuit and the second terminal of the first capacitor, the first isolation circuit isolating the first pumping circuit from the second terminal of the first capacitor responsive to a first logic level of an isolation signal and coupling the output of the first pumping circuit to the second terminal of the first capacitor responsive to a second logic level of the isolation signal; and
    an output circuit coupled to the pumped node, the output circuit being operable to couple the pumped node to an output terminal responsive to an output enable signal; and
    a control circuit operable to generate the charge enable signal, the first and second control signals, the first isolation signal, and the output enable signal.

2. The charge pump of claim 1, wherein the control circuit is operable to generate the charge enable signal, the first, second, third and fourth control signals, the first and second isolation signals, and the output enable signal in the order of:
    the charge enable signal;
    the predetermined transition of the first control signal;
    the first isolation signal;
    the predetermined transition of the second control signal; and
    the output enable signal.

3. The charge pump of claim 1, further comprising:
    a second isolation circuit coupled between the output of the second pumping circuit and the second terminal of the second capacitor, the second isolation circuit isolating the second pumping circuit from the second terminal of the second capacitor responsive to a first logic level of a second isolation signal and coupling the output of the second pumping circuit to the second terminal of the second capacitor responsive to a second logic level of the second isolation signal; and
    wherein the control circuit is further operable to generate the second isolation signal.

4. The charge pump of claim 1 wherein the first isolation circuit comprises:
    a transistor having a gate terminal, a first source-drain terminal coupled to the second terminal of the first capacitor and a second source-drain terminal coupled to receive the output signal of the first pumping circuit;
    a charge pump circuit coupled to the gate terminal of the transistor, the charge pump circuit increasing the voltage at the gate terminal responsive to a transition of the isolation signal from the first logic level to the second logic level to a magnitude sufficient to allow the transistor to pass the second logic level of the output from the first pumping circuit to the second terminal of the first capacitor.

5. The charge pump of claim 1 wherein the charging circuit comprises:
    a transistor having a gate terminal, a first source-drain terminal coupled to a charging voltage and a second source-drain terminal coupled to the pumped node; and
    a charge pump circuit coupled to the gate terminal of the transistor, the charge pump circuit increasing the voltage at the gate terminal responsive to a transition of the charge enable signal to a magnitude sufficient to allow the charging voltage to be coupled through the transistor to the pumped node.

6. The charge pump of claim 1 wherein the output circuit comprises:
    a transistor having a gate terminal, a first source-drain terminal coupled to the pumped node and a second source-drain terminal coupled to the output terminal; and
    a charge pump circuit coupled to the gate terminal of the transistor, the charge pump circuit increasing the voltage at the gate terminal responsive to a transition of the output enable signal to a magnitude sufficient to allow a pumped voltage generated at the pumped node to be coupled through the transistor to the output terminal.

7. The charge pump of claim 1 wherein the control circuit comprises:
    an oscillator generating a periodic signal; and
    a logic circuit coupled to receive the periodic signal from the oscillator, the logic circuit being operable to generate the charge enable signal, the first and second control signals, the first isolation signal, and the output enable signal in a timed sequence based on the periodic signal.

8. The charge pump of claim 1 wherein the first and second capacitors each comprise a transistor having its drain and source terminals coupled to each other to form one of the first and second terminals and its gate forming the other of the first and second terminals.

9. A charge pump, comprising:
    a first capacitor having first and second terminals, the first terminal being coupled to a pumped node;
    a second capacitor having first and second terminals, the first terminal being coupled to the pumped node;
    a charging circuit coupled to the pumped node, the charging circuit being operable to charge the first and second capacitors through the pumped node during a charging period;
    a first pumping circuit coupled to the second terminal of the first capacitor, the first pumping circuit being operable to increase the voltage at the second terminal of the first capacitor during a first pumping period following the charging period;
    an isolation circuit operable to isolate the second terminal of the first capacitor during an isolation period following the first pumping period;
    a second pumping circuit coupled to the second terminal of the second capacitor, the second pumping circuit being operable to increase the voltage at the second terminal of the second capacitor during a second pumping period that encompasses the isolation period; and an output circuit coupled to the pumped node, the output circuit being operable to couple the pumped node to an output terminal during an output period that that encompasses the isolation period and the second pumping period.

10. The charge pump of claim 9 wherein the first isolation circuit comprises:
a transistor having a gate terminal, a first source-drain terminal coupled to the second terminal of the first capacitor and a second source-drain terminal coupled to receive the output signal of the first pumping circuit;
a charge pump circuit coupled to the gate terminal of the transistor, the charge pump circuit increasing the voltage at the gate terminal before the isolation period to a magnitude sufficient to allow the transistor to pass the increased voltage applied to the second terminal of the first capacitor.

11. The charge pump of claim 9 wherein the charging circuit comprises:
a transistor having a gate terminal, a first source-drain terminal coupled to a charging voltage and a second source-drain terminal coupled to the pumped node; and
a charge pump circuit coupled to the gate terminal of the transistor, the charge pump circuit increasing the voltage at the gate terminal during the charging period to a magnitude sufficient to allow a charging voltage to be coupled through the transistor to the pumped node.

12. The charge pump of claim 9 wherein the output circuit comprises:
a transistor having a gate terminal, a first source-drain terminal coupled to the pumped node and a second source-drain terminal coupled to the output terminal; and
a charge pump circuit coupled to the gate terminal of the transistor, the charge pump circuit increasing the voltage at the gate terminal during the output period to a magnitude sufficient to allow a pumped voltage generated at the pumped node to be coupled through the transistor to the output terminal.

13. The charge pump of claim 9 wherein the first and second capacitors each comprise a transistor having its drain and source terminals coupled to each other to form one of the first and second terminals and its gate forming the other of the first and second terminals.

14. A memory device, comprising:
a row address circuit operable to receive row address signals applied to an external terminal and to decode the row address signals to provide a row address;
a column address circuit operable to receive column address signals applied to an external terminal and to decode the column address signals to provide a column address;
at least one array of memory cells operable to store data written to or read from the array at a location determined by the row address and the column address;
a data path circuit operable to couple data signals corresponding to the data between the at least one array and an external data terminal;
a command signal generator operable to generate a sequence of control signals corresponding to command signals applied to an external terminal; and
a charge pump coupled to supply power to at least one component in the memory device, the charge pump comprising:
a first capacitor having first and second terminals, the first terminal being coupled to a pumped node;
a second capacitor having first and second terminals, the first terminal being coupled to the pumped node;
a charging circuit coupled to the pumped node, the charging circuit being operable to charge the first and second capacitors through the pumped node responsive to a charge enable signal;
a first pumping circuit having an output signal, the first pumping circuit transitioning the output signal from a first logic level to a second logic level responsive to a predetermined transition of a first control signal;
a second pumping circuit having an output signal, the second pumping circuit transitioning the output signal from a third logic level to a fourth logic level responsive to a predetermined transition of a second control signal;
a first isolation circuit coupled between the output of the first pumping circuit and the second terminal of the first capacitor, the first isolation circuit isolating the first pumping circuit from the second terminal of the first capacitor responsive to a first logic level of an isolation signal and coupling the output of the first pumping circuit to the second terminal of the first capacitor responsive to a second logic level of the isolation signal; and
an output circuit coupled to the pumped node, the output circuit being operable to couple the pumped node to the at least one component in the memory device responsive to an output enable signal; and
a control circuit operable to generate the charge enable signal, the first and second control signals, the first isolation signal, and the output enable signal.

15. The memory device of claim 14, wherein the control circuit is operable to generate the charge enable signal, the first, second, third and fourth control signals, the first and second isolation signals, and the output enable signal in the order of:
the charge enable signal;
the predetermined transition of the first control signal;
the first isolation signal;
the predetermined transition of the second control signal; and
the output enable signal.

16. The memory device of claim 14, further comprising:
a second isolation circuit coupled between the output of the second pumping circuit and the second terminal of the second capacitor, the second isolation circuit isolating the second pumping circuit from the second terminal of the second capacitor responsive to a first logic level of a second isolation signal and coupling the output of the second pumping circuit to the second terminal of the second capacitor responsive to a second logic level of the second isolation signal; and
wherein the control circuit is further operable to generate the second isolation signal.

17. The memory device of claim 14 wherein the first isolation circuit comprises:
a transistor having a gate terminal, a first source-drain terminal coupled to the second terminal of the first capacitor and a second source-drain terminal coupled to receive the output signal of the first pumping circuit;
a charge pump circuit coupled to the gate terminal of the transistor, the charge pump circuit increasing the voltage at the gate terminal responsive to a transition of the isolation signal from the first logic level to the second logic level to a magnitude sufficient to allow the transistor to pass the second logic level of the output from the first pumping circuit to the second terminal of the first capacitor.

18. The memory device of claim 14 wherein the charging circuit comprises:
   a transistor having a gate terminal, a first source-drain terminal coupled to a charging voltage and a second source-drain terminal coupled to the pumped node; and
   a charge pump circuit coupled to the gate terminal of the transistor, the charge pump circuit increasing the voltage at the gate terminal responsive to a transition of the charge enable signal to a magnitude sufficient to allow the charging voltage to be coupled through the transistor to the pumped node.

19. The memory device of claim 14 wherein the output circuit comprises:
   a transistor having a gate terminal, a first source-drain terminal coupled to the pumped node and a second source-drain terminal coupled to the output terminal; and
   a charge pump circuit coupled to the gate terminal of the transistor, the charge pump circuit increasing the voltage at the gate terminal responsive to a transition of the output enable signal to a magnitude sufficient to allow a pumped voltage generated at the pumped node to be coupled through the transistor to the output terminal.

20. The memory device of claim 14 wherein the control circuit comprises:
   an oscillator generating a periodic signal; and
   a logic circuit coupled to receive the periodic signal from the oscillator, the logic circuit being operable to generate the charge enable signal, the first and second control signals, the first isolation signal, and the output enable signal in a timed sequence based on the periodic signal.

21. The memory device of claim 14 wherein the row address circuit comprises a word line driver operable to generate row activate signals for coupling to word lines in the at least one array of memory cells, and wherein the at least one component in the memory device to which the pumped node is coupled comprises the word line driver.

22. The memory device of claim 14 wherein the at least one array of memory cells is fabricated in a semiconductor substrate, and wherein the at least one component in the memory device to which the pumped node is coupled comprises the semiconductor substrate within which the at least one array of memory cells is fabricated.

23. The memory device of claim 14 wherein the data path circuit comprises a data output register operable to couple data signals to the external data terminal, and wherein the at least one component in the memory device to which the pumped node is coupled comprises the data output register.

24. A memory device, comprising:
   a row address circuit operable to receive row address signals applied to an external terminal and to decode the row address signals to provide a row address;
   a column address circuit operable to receive column address signals applied to an external terminal and to decode the column address signals to provide a column address;
   at least one array of memory cells operable to store data written to or read from the array at a location determined by the row address and the column address;
   a data path circuit operable to couple data signals corresponding to the data between the at least one array and an external data terminal;
   a command signal generator operable to generate a sequence of control signals corresponding to command signals applied to an external terminal; and
   a charge pump coupled to supply power to at least one component in the memory device, the charge pump comprising:
      a first capacitor having first and second terminals, the first terminal being coupled to a pumped node;
      a second capacitor having first and second terminals, the first terminal being coupled to the pumped node;
      a charging circuit coupled to the pumped node, the charging circuit being operable to charge the first and second capacitors through the pumped node during a charging period;
      a first pumping circuit coupled to the second terminal of the first capacitor, the first pumping circuit being operable to increase the voltage at the second terminal of the first capacitor during a first pumping period following the charging period;
      an isolation circuit operable to isolate the second terminal of the first capacitor during an isolation period following the first pumping period;
      a second pumping circuit coupled to the second terminal of the second capacitor, the second pumping circuit being operable to increase the voltage at the second terminal of the second capacitor during a second pumping period that encompasses the isolation period; and
      an output circuit coupled to the pumped node, the output circuit being operable to couple the pumped node to the at least one component in the memory device during an output period that that encompasses the isolation period and the second pumping period.

25. The memory device of claim 24 wherein the first isolation circuit comprises:
   a transistor having a gate terminal, a first source-drain terminal coupled to the second terminal of the first capacitor and a second source-drain terminal coupled to receive the output signal of the first pumping circuit;
   a charge pump circuit coupled to the gate terminal of the transistor, the charge pump circuit increasing the voltage at the gate terminal before the isolation period to a magnitude sufficient to allow the transistor to pass the increased voltage applied to the second terminal of the first capacitor.

26. The memory device of claim 24 wherein the charging circuit comprises:
   a transistor having a gate terminal, a first source-drain terminal coupled to a charging voltage and a second source-drain terminal coupled to the pumped node; and
   a charge pump circuit coupled to the gate terminal of the transistor, the charge pump circuit increasing the voltage at the gate terminal during the charging period to a magnitude sufficient to allow a charging voltage to be coupled through the transistor to the pumped node.

27. The memory device of claim 24 wherein the output circuit comprises:
   a transistor having a gate terminal, a first source-drain terminal coupled to the pumped node and a second source-drain terminal coupled to the output terminal; and
   a charge pump circuit coupled to the gate terminal of the transistor, the charge pump circuit increasing the voltage at the gate terminal during the output period to a magnitude sufficient to allow a pumped voltage generated at the pumped node to be coupled through the transistor to the output terminal.

28. The memory device of claim 24 wherein the row address circuit comprises a word line driver operable to generate row activate signals for coupling to word lines in the at least one array of memory cells, and wherein the at least one component in the memory device to which the pumped node is coupled comprises the, word line driver.

29. The memory device of claim 24 wherein the at least one array of memory cells is fabricated in a semiconductor substrate, and wherein the at least one component in the memory device to which the pumped node is coupled comprises the semiconductor substrate within which the at least one array of memory cells is fabricated.

30. The memory device of claim 24 wherein the data path circuit comprises a data output register operable to couple data signals to the external data terminal, and wherein the at least one component in the memory device to which the pumped node is coupled comprises the data output register.

31. A computer system, comprising:
a processor having a processor bus;
an input device coupled to the processor through the processor bus adapted to allow data to be entered into the computer system;
an output device coupled to the processor through the processor bus adapted to allow data to be output from the computer system; and
a memory device coupled to the processor bus adapted to allow data to be stored, the memory device comprising:
a row address circuit operable to receive row address signals applied to an external terminal and to decode the row address signals to provide a row address;
a column address circuit operable to receive column address signals applied to an external terminal and to decode the column address signals to provide a column address;
at least one array of memory cells operable to store data written to or read from the array at a location determined by the row address and the column address;
a data path circuit operable to couple data signals corresponding to the data between the at least one array and an external data terminal;
a command signal generator operable to generate a sequence of control signals corresponding to command signals applied to an external terminal; and
a charge pump coupled to supply power to at least one component in the memory device, the charge pump comprising:
a first capacitor having first and second terminals, the first terminal being coupled to a pumped node;
a second capacitor having first and second terminals, the first terminal being coupled to the pumped node;
a charging circuit coupled to the pumped node, the charging circuit being operable to charge the first and second capacitors through the pumped node responsive to a charge enable signal;
a first pumping circuit having an output signal, the first pumping circuit transitioning the output signal from a first logic level to a second logic level responsive to a predetermined transition of a first control signal;
a second pumping circuit having an output signal, the second pumping circuit transitioning the output signal from a third logic level to a fourth logic level responsive to a predetermined transition of a second control signal;
a first isolation circuit coupled between the output of the first pumping circuit and the second terminal of the first capacitor, the first isolation circuit isolating the first pumping circuit from the second terminal of the first capacitor responsive to a first logic level of an isolation signal and coupling the output of the first pumping circuit to the second terminal of the first capacitor responsive to a second logic level of the isolation signal; and
an output circuit coupled to the pumped node, the output circuit being operable to couple the pumped node to the at least one component in the memory device responsive to an output enable signal; and
a control circuit operable to generate the charge enable signal, the first and second control signals, the first isolation signal, and the output enable signal.

32. The computer system of claim 31, wherein the control circuit is operable to generate the charge enable signal, the first, second, third and fourth control signals, the first and second isolation signals, and the output enable signal in the order of:
the charge enable signal;
the predetermined transition of the first control signal;
the first isolation signal;
the predetermined transition of the second control signal; and
the output enable signal.

33. The computer system of claim 31, further comprising:
a second isolation circuit coupled between the output of the second pumping circuit and the second terminal of the second capacitor, the second isolation circuit isolating the second pumping circuit from the second terminal of the second capacitor responsive to a first logic level of a second isolation signal and coupling the output of the second pumping circuit to the second terminal of the second capacitor responsive to a second logic level of the second isolation signal; and
wherein the control circuit is further operable to generate the second isolation signal.

34. The computer system of claim 31 wherein the first isolation circuit comprises:
a transistor having a gate terminal, a first source-drain terminal coupled to the second terminal of the first capacitor and a second source-drain terminal coupled to receive the output signal of the first pumping circuit;
a charge pump circuit coupled to the gate terminal of the transistor, the charge pump circuit increasing the voltage at the gate terminal responsive to a transition of the isolation signal from the first logic level to the second logic level to a magnitude sufficient to allow the transistor to pass the second logic level of the output from the first pumping circuit to the second terminal of the first capacitor.

35. The computer system of claim 31 wherein the charging circuit comprises:
a transistor having a gate terminal, a first source-drain terminal coupled to a charging voltage and a second source-drain terminal coupled to the pumped node; and
a charge pump circuit coupled to the gate terminal of the transistor, the charge pump circuit increasing the voltage at the gate terminal responsive to a transition of the charge enable signal to a magnitude sufficient to allow the charging voltage to be coupled through the transistor to the pumped node.

36. The computer system of claim 31 wherein the output circuit comprises:
a transistor having a gate terminal, a first source-drain terminal coupled to the pumped node and a second source-drain terminal coupled to the output terminal; and a charge pump circuit coupled to the gate terminal of the transistor, the charge pump circuit increasing the voltage at the gate terminal responsive to a transition of the output enable signal to a magnitude sufficient to allow a pumped voltage generated at the pumped node to be coupled through the transistor to the output terminal.

37. The computer system of claim 31 wherein the control circuit comprises:
an oscillator generating a periodic signal; and
a logic circuit coupled to receive the periodic signal from the oscillator, the logic circuit being operable to generate the charge enable signal, the first and second control signals, the first isolation signal, and the output enable signal in a timed sequence based on the periodic signal.

38. The computer system of claim 31 wherein the row address circuit comprises a word line driver operable to generate row activate signals for coupling to word lines in the at least one array of memory cells, and wherein the at least one component in the memory device to which the pumped node is coupled comprises the word line driver.

39. The computer system of claim 31 wherein the at least one array of memory cells is fabricated in a semiconductor substrate, and wherein the at least one component in the memory device to which the pumped node is coupled comprises the semiconductor substrate within which the at least one array of memory cells is fabricated.

40. The computer system of claim 31 wherein the data path circuit comprises a data output register operable to couple data signals to the external data terminal, and wherein the at least one component in the memory device to which the pumped node is coupled comprises the data output register.

41. A computer system, comprising:
a processor having a processor bus;
an input device coupled to the processor through the processor bus adapted to allow data to be entered into the computer system;
an output device coupled to the processor through the processor bus adapted to allow data to be output from the computer system; and
a memory device coupled to the processor bus adapted to allow data to be stored, the memory device comprising:
a row address circuit operable to receive row address signals applied to an external terminal and to decode the row address signals to provide a row address;
a column address circuit operable to receive column address signals applied to an external terminal and to decode the column address signals to provide a column address;
at least one array of memory cells operable to store data written to or read from the array at a location determined by the row address and the column address;
a data path circuit operable to couple data signals corresponding to the data between the at least one array and an external data terminal;
a command signal generator operable to generate a sequence of control signals corresponding to command signals applied to an external terminal; and
a charge pump coupled to supply power to at least one component in the memory device, the charge pump comprising:
a first capacitor having first and second terminals, the first terminal being coupled to a pumped node;
a second capacitor having first and second terminals, the first terminal being coupled to the pumped node;
a charging circuit coupled to the pumped node, the charging circuit being operable to charge the first and second capacitors through the pumped node during a charging period;
a first pumping circuit coupled to the second terminal of the first capacitor, the first pumping circuit being operable to increase the voltage at the second terminal of the first capacitor during a first pumping period following the charging period;
an isolation circuit operable to isolate the second terminal of the first capacitor during an isolation period following the first pumping period;
a second pumping circuit coupled to the second terminal of the second capacitor, the second pumping circuit being operable to increase the voltage at the second terminal of the second capacitor during a second pumping period that encompasses the isolation period; and
an output circuit coupled to the pumped node, the output circuit being operable to couple the pumped node to the at least one component in the memory device during an output period that that encompasses the isolation period and the second pumping period.

42. The computer system of claim 41 wherein the first isolation circuit comprises:
a transistor having a gate terminal, a first source-drain terminal coupled to the second terminal of the first capacitor and a second source-drain terminal coupled to receive the output signal of the first pumping circuit;
a charge pump circuit coupled to the gate terminal of the transistor, the charge pump circuit increasing the voltage at the gate terminal before the isolation period to a magnitude sufficient to allow the transistor to pass the increased voltage applied to the second terminal of the first capacitor.

43. The computer system of claim 41 wherein the charging circuit comprises:
a transistor having a gate terminal, a first source-drain terminal coupled to a charging voltage and a second source-drain terminal coupled to the pumped node; and
a charge pump circuit coupled to the gate terminal of the transistor, the charge pump circuit increasing the voltage at the gate terminal during the charging period to a magnitude sufficient to allow a charging voltage to be coupled through the transistor to the pumped node.

44. The computer system of claim 41 wherein the output circuit comprises:
a transistor having a gate terminal, a first source-drain terminal coupled to the pumped node and a second source-drain terminal coupled to the output terminal; and
a charge pump circuit coupled to the gate terminal of the transistor, the charge pump circuit increasing the voltage at the gate terminal during the output period to a magnitude sufficient to allow a pumped voltage generated at the pumped node to be coupled through the transistor to the output terminal.

45. The computer system of claim 41 wherein the row address circuit comprises a word line driver operable to generate row activate signals for coupling to word lines in the at least one array of memory cells, and wherein the at least one component in the memory device to which the pumped node is coupled comprises the word line driver.

46. The computer system of claim 41 wherein the at least one array of memory cells is fabricated in a semiconductor substrate, and wherein the at least one component in the memory device to which the pumped node is coupled comprises the semiconductor substrate within which the at least one array of memory cells is fabricated.

47. The computer system of claim 41 wherein the data path circuit comprises a data output register operable to couple data signals to the external data terminal, and wherein the at least one component in the memory device to which the pumped node is coupled comprises the data output register.

48. A method of generating a pumped voltage having a magnitude that is substantially greater than the magnitude of a supply voltage, comprising:

coupling a first terminal of each of a plurality of capacitors to a pumped node;

while a second terminal of each of the capacitors is at a first voltage, charging the capacitors;

sequentially changing the voltage at the second terminal of each of the capacitors from the first voltage to a second voltage; and except for a final one of the capacitors, after changing the voltage at the second terminal of each of the capacitors from the first voltage to a second voltage but before subsequently changing the voltage at the second terminal of one of the capacitors from the first voltage to the second voltage, isolating the second terminal of the capacitor.

49. The method of claim 48 wherein the act of coupling a first terminal of each of a plurality of capacitors to a pumped node comprises coupling a first terminal of two capacitors to a pumped node.

50. The method of claim 48, further comprising selectively coupling the pumped node to an output terminal.

51. The method of claim 48 wherein the act of charging the capacitors while the second terminal of each of the capacitors is at the first voltage comprises charging the capacitors to substantially the supply voltage while the second terminal of each of the capacitors is at ground potential, and wherein the act of changing the voltage at the second terminal of each of the capacitors from the first voltage to the second voltage comprises changing the voltage at the second terminal of each of the capacitors from ground potential to substantially the supply voltage.

52. A method of generating a pumped voltage, comprising:

coupling a first terminal of each of a plurality of capacitors to a pumped node;

sequentially pumping a second terminal of each of the plurality of capacitors; and sharing the charge of each of the capacitors being pumped with N other capacitors, the number N decreasing by one as each of the capacitors is pumped.

53. The method of claim 52 wherein the act of sharing the charge of each of the capacitors being pumped with N other capacitors, the number N decreasing by one as pumped comprises, after pumping a plurality of the capacitors, of the capacitor that has been pumped.

* * * * *